United States Patent
Choi

(10) Patent No.: US 8,227,685 B2
(45) Date of Patent: Jul. 24, 2012

(54) GRAPHENE SHEET COMPRISING AN INTERCALATION COMPOUND AND PROCESS OF PREPARING THE SAME

(75) Inventor: Jae-young Choi, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 339 days.

(21) Appl. No.: 12/707,213

(22) Filed: Feb. 17, 2010

(65) Prior Publication Data

US 2010/0206363 A1    Aug. 19, 2010

(30) Foreign Application Priority Data

Feb. 17, 2009   (KR) .................. 10-2009-0013137

(51) Int. Cl.
*H01L 31/0224* (2006.01)
*C25B 11/04* (2006.01)
*C01B 31/04* (2006.01)
*B32B 9/00* (2006.01)
*H01M 4/583* (2010.01)

(52) U.S. Cl. ............. 136/252; 204/290.07; 205/80; 252/502; 252/503; 252/506; 252/507; 252/508; 252/509; 423/447.7; 423/447.3; 423/448; 427/248.1; 427/289; 427/301; 428/220; 428/408; 429/231.8

(58) Field of Classification Search ............... 136/252; 204/290.07; 205/80; 252/502, 503, 506–509; 423/447.1, 447.3, 448; 427/248.1, 289, 301; 428/220, 408; 429/231.8
See application file for complete search history.

(56) References Cited

U.S. PATENT DOCUMENTS

| | | | |
|---|---|---|---|
| 5,698,341 A * | 12/1997 | Tamaki et al. | 429/231.8 |
| 7,988,941 B2 * | 8/2011 | Choi et al. | 423/448 |
| 8,075,864 B2 * | 12/2011 | Choi et al. | 423/448 |
| 8,075,950 B2 * | 12/2011 | Choi et al. | 427/221 |
| 2003/0186059 A1 * | 10/2003 | Hirata et al. | 428/408 |
| 2005/0271574 A1 * | 12/2005 | Jang et al. | 423/448 |
| 2009/0071533 A1 * | 3/2009 | Choi et al. | 136/252 |

* cited by examiner

Primary Examiner — Timothy J. Kugel
(74) Attorney, Agent, or Firm — Cantor Colburn LLP

(57) ABSTRACT

A graphene sheet including an intercalation compound and 2 to about 300 unit graphene layers, wherein each of the unit graphene layers includes a polycyclic aromatic molecule in which a plurality of carbon atoms in the polycyclic aromatic molecule are covalently bonded to each other; and wherein the intercalation compound is interposed between the unit graphene layers.

31 Claims, 1 Drawing Sheet

— UNIT LAYER OF GRAPHENE SHEET   ⊗ ⊘ INTERCALATION COMPOUND

GRAPHENE SHEET COMPRISING AN INTERCALATION COMPOUND AND PROCESS OF PREPARING THE SAME

CROSS-REFERENCE TO RELATED APPLICATIONS

This application claims priority to Korean Patent Application No. 10-2009-0013137, filed on Feb. 17, 2009, and all the benefits accruing therefrom under 35 U.S.C. §119, the content of which in its entirety is herein incorporated by reference.

BACKGROUND

1. Field

One or more embodiments relate to a graphene sheet including an intercalation compound and a process of preparing the same.

2. Description of the Related Art

Generally, graphite consists of a stack of two-dimensional graphene sheets formed from a planar array of carbon atoms bonded into a hexagonal structure. Recently, evaluation of the properties of single or multiple-layered graphene sheets revealed that electrons flow in an entirely unhindered fashion in a graphene sheet. Thus, in a graphene sheet the electrons flow at the velocity of light in a vacuum. In addition, an unusual half-integer quantum Hall effect for both electrons and holes is observed in graphene sheets.

However, electrical and physical properties of graphene sheets have further scope for improvement. Thus there remains a need for graphene sheets having improved properties.

SUMMARY

One or more embodiments include a graphene sheet having excellent properties by intercalating an intercalation compound between unit graphene layers.

One or more embodiments include a process of preparing the graphene sheet including an intercalation compound.

One or more embodiments include various applications of the graphene sheet including an intercalation compound.

Additional aspects will be set forth in part in the description which follows and, in part, will be apparent from the description.

According to one or more embodiments, there is provided a graphene sheet including an intercalation compound; and 2 to about 300 unit graphene layers, wherein each unit graphene layer includes a polycyclic aromatic molecule in which a plurality of carbon atoms in the polycyclic aromatic molecule are covalently bonded to each other; and wherein the intercalation compound is interposed between the unit graphene layers.

The graphene sheet including an intercalation compound may be prepared using 2-region vapor phase transport, constant temperature vapor phase transport, liquid phase intercalation, or co-intercalation.

Disclosed is a process of preparing a graphene sheet including an intercalation compound, the process including: forming a graphene sheet; and intercalating an intercalation compound into the graphene sheet using at least one method selected from the group consisting of 2-region vapor phase transport, constant temperature vapor phase transport, an electrochemical method, and liquid phase intercalation.

Also disclosed is a process of preparing a graphene sheet including an intercalation compound, the process including: intercalating an intercalation compound into graphite using one method selected from the group consisting of 2-region vapor phase transport, constant temperature vapor phase transport, an electrochemical method, liquid phase intercalation, and a combination thereof; mechanically cutting the graphite into which the intercalation compound is intercalated; and repeating the cutting of the graphite to obtain a graphene sheet including an intercalation compound.

The graphene sheet including an intercalation compound may be applied to various devices, such as flexible display devices, transparent display devices, memory devices, solar cells, or transparent electrodes.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
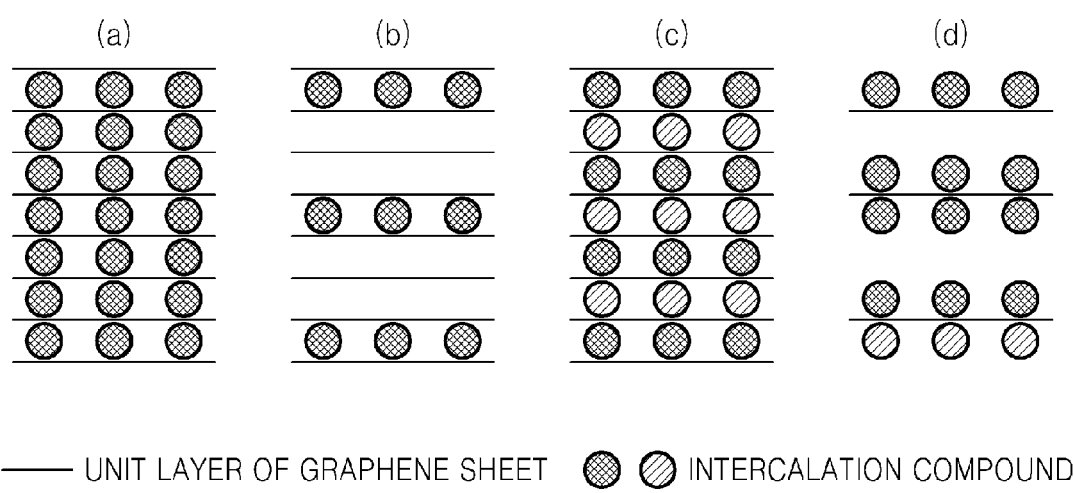
FIG. 1 schematically illustrates an exemplary embodiment of a graphene sheet including an intercalation compound.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer, or section from another element, component, region, layer or section. Thus, a first element, component, region, layer, or section discussed below could be termed a second element, component, region, layer, or section without departing from the teachings of the present invention.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

A graphene sheet including an intercalation compound includes a stack of unit graphene layers and an atomic layer or a molecular layer comprising an intercalation compound interposed between the unit graphene layers. The intercalation compound may have various properties. The atomic layer comprising the intercalation compound is interposed between unit graphene layers of the stack of unit layers.

The intercalation compound intercalated into the graphene sheet may include various compounds without limitation, which as used herein includes elements. For example, the intercalation compound may comprise an alkali metal, a halogen atom, a metal halide, an organic compound, an acidic compound, or a combination comprising at least one of the foregoing. In an embodiment, the intercalation compound may be used alone or in a combination of at least two.

The alkali metal may be lithium, sodium, potassium, rubidium, cesium, or the like, or a combination comprising at least one of the foregoing. The halogen atom may be fluorine, chlorine, bromine, iodine, or the like, or a combination comprising at least one of the foregoing. The metal halide may include IBr, ICl, $AsF_5$, $FeCl_2$, $NiCl_2$, $CoCl_2$, or the like, or a combination comprising at least one of the foregoing. The organic compound may include pentacene, tetracene, anthracene, 9,10-dichloroanthracene, 9,10-dibromoanthracene, or the like, or a combination comprising at least one of the foregoing. The acidic compound may include an organic acid such as acetic acid or the like, an inorganic acid such as nitric acid, hydrochloric acid, sulfuric acid, or the like, or a combination comprising at least one of the foregoing.

The unit graphene layer is a polycyclic aromatic molecule in which a plurality of carbon atoms are covalently bonded to each other. The covalently bonded carbon atoms form 6-membered rings as a repeating unit, and may also form 5-membered rings and/or 7-membered rings. Accordingly, in the unit graphene layer, the covalently bonded carbon atoms (usually, $sp^2$ hybridized) form a single layer. The graphene sheet may have not only a single unit graphene layer, but may comprise a plurality of unit graphene layers and may have a thickness of equal to or less than 100 nanometers (nm), specifically equal to or less than 90 nm, more specifically equal to or less than 80 nm. In general, the edges of a unit graphene layer are saturated with hydrogen atoms. The number of unit graphene layers may be 2 to about 300, specifically about 2 to about 200, more specifically about 4 to about 100. If the number of unit graphene layers is greater than 300, electrical properties of the graphene sheet may be degraded.

The graphene sheet may have various structures, e.g., a regularly and periodically arranged structure. The intercalation compound may have a regular shape and may be arranged between the unit graphene layers at a regular interval. In addition, the number of unit graphene layers interposed between layers of the intercalation compound may be constant. For example, about 1 to about 4, specifically about 2 to about 3, more specifically 1 unit graphene layer may be interposed between layers of the intercalation compound. FIG. 1 schematically illustrates exemplary embodiments of various graphene sheets including an intercalation compound.

Even though the intercalation compound is interposed between unit graphene layers, the graphene sheet including an intercalation compound may have its own intrinsic transmittance. The transmittance of the graphene sheet including the intercalation compound may be about 5 to about 99 percent (%), specifically 10 to about 90%, more specifically 20 to about 80 percent.

The intercalation compound may be intercalated into the graphene sheet using at least two methods. In a first method, a graphene sheet including an intercalation compound may be prepared by intercalating an intercalation compound into graphite particles and then thinning the intercalation compound-containing graphite particles. In this regard, a mechanical method, e.g., a method using an adhesive tape, may be used to thin the intercalation compound-containing graphite particles. According to the first method, adhesive tapes are attached to both sides of an intercalation compound-containing graphite particle, and then the adhesive tapes are pulled in opposite directions to divide the intercalation compound-containing graphite particle into two portions. By repeating this process, a thin graphene structure including an intercalation compound may be obtained. This process is simple. The intercalation compound may be intercalated into the graphite using 2-region vapor phase transport, constant temperature vapor phase transport, an electrochemical method, or liquid phase intercalation.

In a second method, a graphene sheet may be prepared, and then an intercalation compound may be intercalated into the graphene sheet. According to the second method, a large-sized graphene sheet including the intercalation compound may be prepared.

The method of preparing the graphene sheet, and then intercalating the intercalation compound into the graphene sheet, will be further described.

First, a graphene sheet is used as a host material into which the intercalation compound is intercalated. The graphene sheet may be prepared using the following method.

(A) Preparation of Graphene as a Host Material

Graphene may be prepared using a mechanical method or a chemical method.

In a mechanical method, an adhesive tape may be used. According to the method, a thin graphene structure may be prepared by attaching adhesive tapes to opposite sides of a graphite particle, pulling the adhesive tapes in opposite directions to divide the graphite into two portions, and repeating this process.

According to the chemical method, a graphene sheet may be prepared by disposing a substrate having at least one surface on which a graphitizing catalyst is disposed, contacting a carbonaceous material, as a carbon source, with the substrate, and forming graphene on the graphitizing catalyst by heat-treating the catalyst and the carbonaceous material in an inert or reducing atmosphere.

The graphitizing catalyst may be formed (e.g., disposed) on the substrate using a method that is used for disposing a metallic coating without limitation. For example, the graphitizing catalyst may be formed on the substrate using a vapor deposition method such as sputtering, chemical vapor deposition ("CVD"), or e-beam deposition, or any method used to uniformly form a catalyst metal layer. Furthermore, the graphitizing catalyst may be formed by printing, or a highly precise pattern may be formed in or on the graphitizing catalyst by photolithography.

In the case of photolithography, the highly precise pattern of the graphitizing catalyst may be formed by depositing the graphitizing catalyst on the entire surface of the substrate, disposing a photoresist layer thereon, applying a photomask thereto, performing exposure to light, and etching. As further described above, if the graphitizing catalyst having a pattern is disposed on the substrate, graphene having the pattern may be formed.

After disposing the graphitizing catalyst on the substrate, a carbonaceous material is contacted with the graphitizing catalyst. The contacting process may be performed using at least one method selected from the group consisting of: coating a carbon-containing polymer, as the carbonaceous material, on the substrate on which the pattern is disposed; supplying a gaseous carbonaceous material, as the carbonaceous material, onto the substrate on which the pattern is disposed; and immersing the substrate, on which the pattern is disposed, in a liquid carbonaceous material, as a carbonaceous material, and pre-heat-treating the immersed substrate.

When the graphitizing catalyst layer disposed on the substrate is removed by an acid-treatment, the graphene pattern directly contacts the substrate. In another embodiment, which omits the acid-treatment, the substrate, the graphitizing catalyst layer, and the graphene pattern are sequentially disposed.

The substrate on which the graphene pattern is disposed may be an inorganic substrate, such as a silicon (Si) substrate, a glass substrate, or a gallium nitride (GaN) substrate, or a plastic substrate comprising a material such as polyethylene terephthalate ("PET"), polyether sulfone ("PES"), or polyethylene naphthalate ("PEN"), or a metal substrate comprising nickel (Ni), copper (Cu), or tungsten (W), but is not limited thereto.

The graphitizing metal catalyst constituting the graphitizing catalyst layer may have a polycrystalline or single crystalline structure. If the graphitizing metal catalyst has a polycrystalline structure, the graphitizing metal catalyst may be easily and inexpensively prepared. However, if the graphitizing metal catalyst has a single crystalline structure, grains, that are present in the polycrystalline structure, are not present in the single crystalline structure, and a uniform graphene pattern may be formed from the single crystalline graphitizing metal catalyst because the rate of graphene formation is the same throughout the entire surface of the graphene sheet.

The uniformity of the graphene may be identified using a Raman spectrum, for example, by the existence of a D band. The D band in a Raman spectrum indicates the existence of defects of the graphene. A strong D band indicates a large number of defects, and a weak D band or no D band indicates a small number or zero defects.

The graphene sheet prepared by epitaxial growth using the graphitizing metal catalyst has a ratio of an intensity of a D band peak to an intensity of a G band peak in the Raman spectrum of the graphene sheet which may is equal to or less than 0.2, specifically equal to or less than 0.01, more specifically equal to or less than 0.001. In an embodiment, the ratio of an intensity of a D band peak to an intensity of a G band peak in the Raman spectrum of the graphene sheet may be 0 (zero).

The graphitizing metal catalyst assists bonding of the carbon elements to each other to form a planar hexagonal structure. Any catalyst used to synthesize graphite, induce carbonization, or prepare carbon nanotubes may be used as the graphitizing catalyst. Examples of the graphitizing metal catalyst include at least one selected from the group consisting of Ni, Co, Fe, Pt Au, Al, Cr, Cu, Mg, Mn, Mo, Rh, Si, Ta, Ti, W, U, V, Z, and any alloys thereof.

If the graphitizing metal catalyst has a single crystalline structure, the graphitizing metal catalyst may be prepared by crystallizing the metal or alloy to form a single crystal, or any commercially available single crystalline metal may be used. In general, a commercially available single crystalline metal may have a rod shape which may be cut into thin films or wafers for use in the form of a sheet.

The carbonaceous material contacted with the graphitizing catalyst to form the graphene may be any material containing carbon regardless of its structure or composition without limitation. A carbonaceous material that can be disposed as a dense coating may be used to form a dense graphite layer. The carbonaceous material may be a carbon-containing polymer, a gaseous carbonaceous material, a liquid carbonaceous material, or a combination comprising at least one of the foregoing.

Any carbon-containing polymer may be used as the carbonaceous material. For example, a self-assembling polymer may be efficiently used because it is regularly arranged and extends perpendicularly from the surface of the graphitizing catalyst, and thus a graphene pattern having a dense structure may be prepared from the self-assembling polymer.

The self-assembling polymer forming the self-assembled layer may include at least one selected from the group consisting of an amphiphilic polymer, a liquid crystal polymer, a conductive polymer, and a mixture comprising at least one of the foregoing.

The amphiphilic polymer includes a hydrophilic group and a hydrophobic group, and thus may be arranged in a constant direction in a water-soluble (e.g., aqueous) solution. For example, the amphiphilic polymer may have a Langmuir-Blodgett arrangement, a dipping arrangement, or a spin arrangement. The amphiphilic polymer includes: a hydrophilic group including at least one selected from the group consisting of an amino group, a hydroxyl group, a carboxyl group, a sulfate group, a sulfonate group, a phosphate group, salts thereof, and a mixture comprising at least one of the foregoing hydrophilic groups; and a hydrophobic group is selected from the group consisting of a halogen atom, a C1-C30 alkyl group, a C1-C30 halogenated alkyl group, a C2-C30 alkenyl group, a C2-C30 halogenated alkenyl group, a C2-C30 alkynyl group, a C2-C30 halogenated alkynyl group, a C1-C30 alkoxy group, a C1-C30 halogenated alkoxy group, a C1-C30 heteroalkyl group, a C1-C30 halogenated heteroalkyl group, a C6-C30 aryl group, a C6-C30 halogenated aryl group, a C7-C30 arylalkyl group, a C7-C30 halogenated arylalkyl group, and a mixture comprising at least one of the foregoing hydrophobic groups. Examples of the amphiphilic polymer include capric acid, lauric acid, palmitic acid, stearic acid, myristoleic acid, palmitolic acid, oleic acid, stearidonic acid, linolenic acid, capryl amine, lauryl amine, stearyl amine, oleyl amine, or a combination comprising at least one of the foregoing.

The liquid crystal polymer may be arranged in a single direction in a liquid state. The conductive polymer is dissolved in a solvent to form a membrane and may form a crystal structure by being aligned after the solvent is evaporated. Thus, the polymers may be aligned in a dipping arrangement, a spin coating arrangement, or the like. Examples of the polymer include polyacetylene, polypyrrole, polythiophene, polyaniline, polyfluorene, poly(3-hexylthiophene), polynaphthalene, poly(p-phenylene sulfide), poly(p-phenylene vinylene), or a combination comprising at least one of the foregoing.

In another embodiment, a polymer that spontaneously aligns in a single direction when deposited from a vapor state, such as, for example, a conductive polymer formed using deposition, may also be used herein. Examples of the conductive polymer include acene or derivatives thereof, anthracene or derivatives thereof, heteroanthracene (e.g., benzodithiophene or dithienothiopene) or derivatives thereof, tetracene or derivatives thereof (e.g., halogenated tetracene, tetracene derivatives having a polar substituent, tetracene-thiopene hybrid materials, rubrene, or alkyl- and alkoxy-substituted tetracene), heterotetracene or derivatives thereof, pentacene or derivatives thereof (e.g., alkyl- or halogen-substituted pentacene, aryl-substituted pentacene, alkynyl-substituted pentacene, alkynyl-substituted alkyl or alkynyl pentacene, or alkynyl-substituted pentacene ether), heteropentacene or derivatives thereof, or heteroacene or derivatives thereof.

The carbon-containing polymer may include at least one polymerizable functional group comprising a carbon-carbon double bond or a triple bond. The polymerizable functional group may induce polymerization (e.g., cross-linking) of polymers through a process of polymerization including UV irradiation, for example, after the polymer layer is formed. Because the thus formed polymer has a high molecular weight, evaporation of carbon may be substantially reduced or effectively prevented during the heat-treatment of the polymer.

The polymerization of the carbon-containing polymer may be performed before or after coating the polymer on the graphitizing catalyst. In an embodiment, when the polymerization of the carbon-containing polymer is induced before coating the polymer on the graphitizing catalyst, a carbonaceous material layer may be disposed by transferring a polymer membrane prepared by polymerization to the graphitizing catalyst. The polymerization and transfer may be repeated several times to control the thickness of the graphene sheet.

The carbon-containing polymer may be aligned on the surface of the graphitizing catalyst using various coating methods, such as Langmuir-Blodgett deposition, dip coating, spin coating, or vacuum deposition. The carbon-containing polymer may be coated on an entire surface of the substrate or selectively coated on the graphitizing catalyst.

In an embodiment wherein the carbon-containing polymer is selectively coated on the graphitizing catalyst, the carbon-containing polymer may have a pattern identical to or similar to that of the graphitizing catalyst. If the carbon-containing polymer is coated on the entire surface of the substrate, the carbon-containing polymer coated on the portion of the substrate without the graphitizing catalyst is thermally decomposed during the subsequent heat-treatment or remains as amorphous carbon. The amorphous carbon may be selectively removed during the subsequent processes.

In an embodiment, the molecular weight of the aligned carbon-containing polymer on the substrate, the thickness of the pattern, or the number of self-assembled polymer layers may vary depending on a desired number of layers of the graphene sheet. In an embodiment, as the molecular weight of the carbon-containing polymer increases, the number of layers of the graphene sheet increases. As the thickness of the pattern increases, the number of unit graphene layers of the graphene sheet increases, and thus the thickness of the graphene sheet also increases. The thickness of the graphene layer may be controlled according to the molecular weight of the carbon-containing polymer.

In addition, the amphiphilic polymer, which is a self-assembling polymer, includes a hydrophilic group and a hydrophobic group. The hydrophilic group of the polymer is combined with (e.g., contacts) the hydrophilic graphitizing catalyst to be uniformly aligned on the catalyst layer, and the hydrophobic group of the amphiphilic polymer is aligned in the opposite direction to be combined with (e.g., contact) the hydrophilic group of another amphiphilic polymer that is not combined with the catalyst layer. When the amount of the amphiphilic polymer is sufficient, the amphiphilic polymer may be sequentially stacked on the catalyst layer by the hydrophilic-hydrophobic bonds. The stacked layers comprising a plurality of the amphiphilic polymers may form a graphene layer by heat-treatment. Thus, a graphene sheet having a desired thickness may be prepared because the number of graphene layers may be controlled by selecting an appropriate amphiphilic polymer and selecting the amount of the amphiphilic polymer.

In an embodiment, a gaseous carbonaceous material, as the carbonaceous material source, may be contacted with the graphitizing catalyst disposed on the substrate and thermally decomposed to form graphene. Any material that may supply carbon and be in a gas phase at 300° C. or higher may be used as the carbon source without limitation. The gaseous carbon source may be a compound containing carbon atoms. The compound may include equal to or less than 6 carbon atoms, equal to or less than 4 carbon atoms, or equal to or less than 2 carbon atoms. The carbonaceous material source may include at least one selected from the group consisting of carbon monoxide, ethane, ethylene, ethanol, acetylene, propane, propylene, butane, butadiene, pentane, pentene, cyclopentadiene, hexane, cyclohexane, benzene, and toluene.

The gaseous carbonaceous material may be added to a chamber including a graphitizing catalyst at a constant pressure. The chamber may only include the gaseous carbonaceous material, or may further include an inert gas such as helium or argon.

In addition, hydrogen may be used with the gaseous carbonaceous material in order to control gaseous reactions by cleaning the surface of a metal catalyst. The amount of the hydrogen may be about 5 to about 40% by volume, specifically about 10 to about 30% by volume, more specifically about 15 to about 25% by volume.

In addition, the liquid carbonaceous material, as the carbonaceous material, is contacted with the substrate on which the graphitizing catalyst is disposed and decomposed by the pre-heat-treatment. The product of the decomposition of the liquid carbonaceous material (e.g., carbon) is intercalated into the graphitizing catalyst by carburization. The contacting may be performed by immersion.

The liquid carbonaceous material may be an organic solvent, and any liquid carbonaceous material that may be thermally decomposed by the graphitizing catalyst may be used without limitation. A polar or nonpolar organic solvent having a boiling point of about 60 to about 400° C. may be used. The organic solvent may be an alcohol-based organic solvent, an ether-based organic solvent, a ketone-based organic solvent, an ester-based organic solvent, or an organic acid-based organic solvent. The alcohol-based organic solvent and the ether-based organic solvent may be used since they are easily adsorbed to the graphitizing metal catalyst, have high reactivity, and excellent reducing properties. The alcohol-based organic solvent may be a monohydric alcohol or a polyhydric alcohol. The monohydric alcohol may be propanol, pentanol, hexanol, heptanol, octanol, or the like. The polyhydric alcohol may be propylene glycol, diethylene glycol, dipropylene glycol, triethylene glycol, tripropylene glycol, octylene glycol, tetraethylene glycol, neopentyl glycol, 1,2-buthandiol, 1,3-buthandiol, 1,4-buthandiol, 2,3-buthandiol, dimethyl-2, 2-buthandiol-1,2, dimethyl-2,2-buthandiol-1,3, or the like. The monohydric alcohol and the polyhydric alcohol may further include an ether group in addition to the hydroxyl group. A combination comprising at least one of any of the foregoing solvents can be used, for example a combination of a monohydric alcohol solvent and a polyhydric alcohol solvent.

The liquid carbonaceous material may be used alone or used with a base. If a base is added to the liquid carbonaceous material, carburization occurs more quickly and thus the time for the formation of the graphene pattern may be reduced and aggregation of particles may be controlled by increasing viscosity. The base may be added thereto alone or with water to increase the solubility of the base. The base may be an organic base and/or inorganic base. For example, tetramethyl ammonium chloride ("TMAH"), sodium hydroxide, potassium hydroxide, or the like, or a combination comprising at least one of the foregoing may be used. The concentration of the base in the organic solvent may be about 0.01 to about 5.0 molar (M), specifically about 0.05 to about 2.0 M, more specifically about 0.1 to about 1.0 M, but is not limited thereto. If the concentration of the base is less than 0.01 M, the carburizing rate is too low, and aggregation of particles may not be controlled. If the concentration of the base is greater than 5.0 M, viscosity is so high that particles are not separated from the organic solvent and a washing process may not be smoothly performed.

If the liquid carbonaceous material is used, carburization may be performed by pre-heat-treatment. In the pre-heat-treatment process, the liquid carbonaceous material is thermally decomposed by the graphitizing catalyst. The thermal decomposition of the liquid carbonaceous material by the graphitizing catalyst is disclosed in Cortright, R. D. et al., "Hydrogen from Catalytic Reforming of Biobass-derived Hydrocarbons in Liquid Water", Nature, vol. 418, Aug. 29, 2002, pp. 964-967, which is incorporated herein by reference in its entirety. For example, products of the thermal decomposition of the organic solvent, such as polyhydric alcohol, include alkane, $H_2$, $CO_2$, and $H_2O$. Carbon among the decomposition products is carburized in the catalyst.

The pre-heat-treatment for the thermal decomposition may be performed while stirring in order to sufficiently mix the liquid carbonaceous material and the catalyst at a temperature of about 100 to about 400° C., specifically about 150 to about 350° C., more specifically about 200 to about 300° C. for about 10 minutes to about 24 hours, specifically about 20 minutes to about 12 hours, more specifically about 30 minutes to about 6 hours. If the temperature of the pre-heat-treatment is less than 100° C., the thermal decomposition may not be sufficiently performed. If the temperature of the pre-heat-treatment is greater than 400° C., particles may melt and become aggregated. If the pre-heat-treatment time is less than 10 minutes, the organic solvent may not be sufficiently decomposed. If the pre-heat-treatment time is greater than 24 hours, effects of the long pre-heat-treatment time are negligible.

In an embodiment, the amount of carbon in the graphitizing catalyst may be controlled by regulating the degree of the carburization, and thus the thickness of the graphene layer formed during the graphene formation may be controlled. For example, if a liquid carbonaceous material which is easily decomposed during the decomposition process is used, the amount of decomposed carbon increases, and thus a large amount of carbon is carburized in the graphitizing catalyst. In addition, the amount of carbon carburized in the graphitizing catalyst may be controlled by regulating the carburization process by controlling the temperature and time of the heat-treatment. Therefore, the formation of the graphene may be controlled, and the thickness of the graphene sheet may be easily controlled.

The graphene sheet comprising the graphene pattern may be a stack comprising a plurality of unit graphene layers. In this regard, the graphene sheet may have 2 to about 300 unit graphene layers, specifically about 3 to about 200 unit graphene layers, more specifically about 4 to about 100 unit graphene layers. In an embodiment, the graphene sheet may have 2 to about 60 unit graphene layers. A graphene sheet having over 300 layers is regarded as graphite, which is not within the scope of the present invention.

The carbonaceous material, such as the carbon-containing polymer, the liquid carbonaceous material, the gaseous carbonaceous material, or the combination comprising at least one of the foregoing, is contacted with the graphitizing catalyst, and the heat treatment is performed to graphitize the carbonaceous material. The heat treatment may be performed in an inert or reducing atmosphere in order to substantially reduce or effectively prevent oxidation of the carbonaceous material. The carbon atoms of the organic material are covalently bonded to each other by the heat treatment. For example, the carbon atoms may form a planar hexagonal structure to form graphene on the substrate.

The heat treatment may be performed at a temperature ranging from about 400 to about 2,000° C., specifically about 500 to about 1,800° C., more specifically about 600 to about 1,600° C. If the heat-treatment temperature is less than 400° C., graphitizing may not be sufficiently performed. If the heat-treatment temperature is greater than 2,000° C., carbon may be volatilized. The heat treatment may be performed for about 1 second to about 10 hours, specifically for about 30 seconds to about 5 hours, more specifically for about 1 minute to about 1 hour. If the heat-treatment time is not within the foregoing range, graphitization may be insufficient, or effects of a long heat-treatment time are negligible.

The heat treatment may be performed by induction heating, radiation heating, laser heating, heating by infrared ("IR") rays, microwave heating, plasma heating, heating by ultraviolet ("UV") rays, or surface plasmon heating.

After the heat treatment, the heat-treated material is cooled. The cooling is performed to uniformly grow and arrange graphene. The cooling stops the formation of graphene, thereby producing the graphene sheet. If the cooling is performed too slowly, the graphene may not form uniformly. Thus, the heat-treated graphene may be cooled at a rate of about 0.1 to about 10,000° C. per minute, specifically at about 1 to about 1,000° C. per minute, more specifically at about 10 to about 100° C. per minute. For example, the heat-treated graphene may be cooled at a rate of about 1.0 to about 1,000° C. per minute. The heat-treated graphene may be naturally cooled (e.g., by ambient convection). The natural cooling may be performed by simply removing a heat source. A sufficient cooling rate of over 1,000° C. per minute may be obtained by removing only the heat source. In order to increase the cooling rate, a cooling gas such as argon (Ar), hydrogen ($H_2$), or nitrogen ($N_2$) may be used.

According to an embodiment of the process of forming the graphene disclosed above, the graphitizing catalyst layer and the graphene are sequentially formed on at least one surface of the substrate. The graphitizing catalyst layer may be retained or be removed by acid-treatment if desired so that the graphene is directly bound to the substrate.

The area of the graphene sheet may be varied by controlling the size of the substrate on which the graphitizing catalyst is disposed, and a large-sized graphene sheet may be easily formed. That is, a large-sized substrate, e.g., a substrate having an area of 1 millimeter (mm) by 1 mm, specifically, a substrate having an area of about 1 mm by 1 mm to about 1,000 mm by 1,000 mm, more specifically about 10 mm by 10 mm to about 100 mm by 100 mm, may be used. The size of the substrate is not limited. In an embodiment, a large-sized graphene sheet may be prepared by forming (e.g., disposing) a graphitizing catalyst on a substrate using at least one of the various methods described above. Thus, the area of the graphene sheet may be controlled by regulating the size of the substrate. The substrate may be a silicon substrate, but is not limited thereto.

The width and length of the graphene sheet having a controlled area may independently be equal to or greater than 1 mm, equal to or greater than 10 mm, or about 10 mm to about 1,000 mm, and the width and length of the substrate are not limited thereto. For example, a long graphene sheet in a roll shape may be prepared by using a continuous or semi-continuous (e.g., roll-to-roll) rolled substrate in the graphene formation process. The width and the length may be applied to a tetragonal sheet. If the sheet is has an irregular shape, the width and the length may be appropriately determined, for example the longest side may be regarded as the length, and the shortest side may be regarded as the width. If the sheet is formed in a circular shape, the diameter thereof may be regarded as the width and the length. If the sheet is has an oval shape, a major axis and a minor axis may be regarded as the length and the width, respectively.

(B) Intercalation of the Intercalation Compound into the Graphene Sheet

An intercalation compound may be intercalated into the graphene sheet prepared as disclosed above using a 2-region vapor phase transport method, a constant temperature vapor phase transport method, liquid phase intercalation, electrochemical method, co-intercalation, sequential intercalation, or the like.

(B-1) 2-Region Vapor Phase Transport

Figure 2:
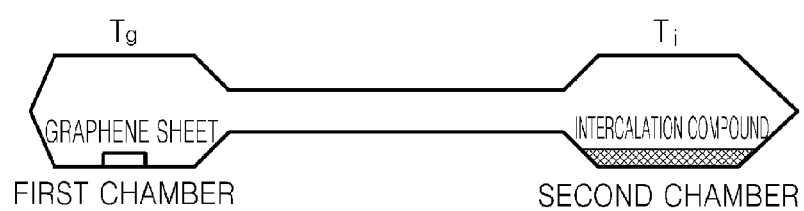
FIG. 2 schematically illustrates an exemplary embodiment of a reactor for 2-region vapor phase transport.

FIG. 2 schematically illustrates an exemplary embodiment of a reactor for 2-region vapor phase transport. Referring to FIG. 2, a graphene sheet and an intercalation compound are respectively disposed in a first chamber and a second chamber, which are connected to each other by a pathway. The first chamber and the second chamber are independently heated to vaporize the intercalation compound, and then the vaporized intercalation compound is diffused to and intercalated into the graphene sheet, thereby forming a plurality of intercalation compound layers.

The amount and arrangement of the intercalation compound may vary according to parameters such as the type of the intercalation compound, the temperature of the chambers, or vapor pressure of the intercalation compound.

As the molecular size of the intercalation compound is decreased, the intercalation compound is more quickly intercalated into the graphene sheet, and thus the intercalation compound layers are arranged. As the vapor pressure is increased, the amount of the intercalation compound intercalated into the graphene sheet increases.

The temperature of the first and second chambers influences the arrangement of the intercalation compound. The arrangement of the intercalation compound in the matrix of the graphene sheet may vary depending on the difference between the temperature ("Tg") of the first chamber including the graphene sheet and the temperature ("Ti") of the second chamber including the intercalation compound, thus the temperature difference Tg–Ti. As the temperature difference increases, the number of unit graphene layers between the intercalation compound layers increases. For example, if the temperature difference is less than 100° C., a single unit graphene unit layer is interposed between the intercalation compound layers. If the temperature difference is in the range of about 100 to about 200°, two unit graphene layers are interposed between the intercalation compound layers. If the temperature difference is about 200 to about 300° C., three unit graphene layers are interposed between the intercalation compound layers.

When the intercalation is completed, the first and second chambers are cooled. The second chamber including the intercalation compound may be cooled first in order to substantially reduce or effectively prevent exfoliation during the cooling process.

(B-2) Constant Temperature Vapor Phase Transport

According to a constant temperature vapor phase transport method, the intercalation compound is intercalated into the graphene sheet by supplying a vapor phase intercalation compound into a chamber, which includes the graphene sheet, at a high pressure. In this regard, the temperature of the chamber may be constantly maintained, for example, at room temperature.

The partial pressure of the vapor phase intercalation compound may be about 1 to about 5 atmospheres (atm), specifically about 2 to about 4 atm, more specifically about 3 atm.

According to the constant temperature vapor phase transport method, the number of unit graphene layers interposed between the intercalation compound layers may be controlled by selecting the amount of the intercalation compound. If the amount of the intercalation compound is decreased, the number of unit graphene layers interposed between the intercalation compound layers increases.

(B-3) Liquid Phase Intercalation

According to the liquid phase intercalation method, the intercalation compound is intercalated into the graphene sheet by immersing the graphene sheet in a liquid phase intercalation compound.

The liquid phase intercalation compound may be a solution, a dispersion of the intercalation compound, a pure intercalation compound in a liquid phase, or a combination comprising at least one of the foregoing.

(B-4) Electrochemical Method

According to the electrochemical method, the intercalation compound is intercalated into the graphene sheet by electrolysis in an electrolyte using the graphene sheet as an electrode and the intercalation compound as a counter electrode.

In this regard, the graphene sheet is used as an anode, and the intercalation compound or a material including the intercalation compound is used as a cathode. The intercalation compound is intercalated into the graphene sheet by applying a voltage to the electrodes. For example, the graphene sheet may be used as the anode, lithium may be used as the cathode, and an electrolyte, in which a lithium salt is dissolved, may be used to enhance ion transportation between the two electrodes. By applying a voltage, lithium ions of the cathode are transported to the anode and intercalated into the graphene sheet to form a lithium-containing graphene sheet. In this regard, propylene carbonate or a mixture comprising ethylene carbonate and diethyl carbonate may be used as a solvent for the electrolyte. The lithium salt may include at least one selected from the group consisting of $LiClO_4$, $LiBF_6$, and $LiPF_6$.

(B-4) Co-Intercalation

According to co-intercalation, at least two types of intercalation compounds are simultaneously intercalated into the graphene sheet. The co-intercalation may be efficiently applied to the intercalation of various metal alloys or complexes as a precursor of the intercalation compound.

The co-intercalation may be performed using the vapor phase transport or liquid phase intercalation methods, and it is different from these methods in that at least two chemically different compounds are used.

(B-5) Sequential Intercalation

According to sequential intercalation, at least two types of intercalation compounds are intercalated into the graphene sheet. Like co-intercalation, the sequential intercalation may be performed using the vapor phase transport or liquid phase intercalation methods when intercalating at least two chemically different materials.

When the intercalation is performed by combining sequential intercalation and co-intercalation, the range of intercalation compounds used may be extended.

The method of intercalating the intercalation compound into the graphene sheet may be selected according to the phase of the intercalation compound. If the intercalation compound is metal which is a solid phase at room temperature, 2-region vapor phase transport may be used. If the intercalation compound is a liquid phase or a solution comprising a solvent, liquid phase intercalation may be used. If the intercalation compound is in a vapor (i.e., gas) phase at room temperature, constant temperature vapor phase transport may be used.

The graphene sheet including an intercalation compound prepared using the process disclosed above may have controlled electrical, optical, quantum and energy properties without deteriorating the intrinsic physical properties of the graphene sheet such as flexibility and transparency.

Thus, the graphene sheet including the intercalation compound may be efficiently used as a transparent electrode due to its excellent conductivity and uniformity. In a solar cell, an electrode is disposed on a substrate, and thus is desirably transparent. In an embodiment wherein the graphene sheet including the intercalation compound is used as a transparent electrode, a flexible transparent electrode with excellent electrical conductivity may be easily prepared due to flexibility of the graphene sheet. In another embodiment, if a flexible plastic is used as a substrate, and the graphene sheet is used as a transparent electrode, a flexible solar cell including the graphene sheet may be prepared. In addition, if the graphene sheet including the intercalation compound is used as a conductive thin film for a panel, such as a display device, a desired conductivity may be obtained and light transmittance may be increased.

In addition, the graphene sheet including an intercalation compound having a tube shape may be used as an optical fiber, a hydrogen storage medium, or a membrane that selectively allows hydrogen to penetrate therethrough.

Hereinafter, embodiments will be described in detail with reference to the following examples. However, these examples are not intended to limit the purpose and scope of the disclosed embodiments.

Preparation Example 1

Nickel was deposited to a thickness of 300 nm using an e-beam evaporator on a 3 centimeter (cm) by 3 cm silicon substrate on which $SiO_2$ was coated.

The silicon substrate on which the $SiO_2$ and Ni thin film were formed was disposed in a chamber heated to 1,000° C., and a gaseous mixture including methane, hydrogen, and argon was supplied into the chamber at 50, 65, and 200 standard cubic centimeters per minute ("sccm"), respectively, for 3 minutes. Then, the resulting material was cooled to room temperature at a cooling rate of 10° C. per second while supplying argon to form a graphene sheet having about 2 to about 5 layers on the graphitizing catalyst.

Then, the substrate on which the graphene sheet was formed was immersed in a 1M $FeCl_3$ solution for 10 minutes to remove the nickel thin film in order to separate the graphene sheet from the substrate. The separated graphene sheet was transferred to the silicon substrate using polydimethyl siloxane ("PDMS").

Example 1

A quartz reactor including a first chamber and a second chamber connected to each other by a pathway was prepared. The graphene sheet prepared according to Preparation Example 1 was disposed in the first chamber, and 0.1 g of potassium was disposed in the second chamber. Then, the first and the second chambers were sealed by heating both ends of the quartz reactor. The first chamber was heated to a temperature of 250° C., and the second chamber was heated to a temperature of 300° C. After these temperatures were maintained for 48 hours, the second chamber was cooled, and then the first chamber was cooled to prepare a graphene sheet including a plurality of potassium layers.

A single unit layer of graphene was identified between the potassium layers by X-ray diffraction. The transmittance of the graphene sheet including the potassium was about 85%.

Example 2

A graphene sheet including a plurality of $AsF_5$ layers was prepared by disposing the graphene sheet prepared according to Preparation Example 1 in the chamber, supplying $AsF_5$ into the chamber at 3.0 atm while maintaining room temperature, and maintaining the temperature for 48 hours.

A single unit layer of graphene was identified between the $AsF_5$ layers by X-ray diffraction. The transmittance of the graphene sheet including $AsF_5$ was about 80%.

Example 3

The graphene sheet prepared according to Preparation Example 1 was immersed in a container in which 5.0 g of $FeCl_3$ was dissolved in 50 ml of nitromethane ("NM"). The container was maintained at room temperature for 48 hours to prepare a graphene sheet including a plurality of $FeCl_3$ layers.

A single unit layer of graphene was identified between the $FeCl_3$ layers by X-ray diffraction. The transmittance of the graphene sheet including $FeCl_3$ was about 80%.

Example 4

Graphene sheets respectively including $Cl_2$ and $Br_2$ were prepared in the same manner as in Example 2, except that $Cl_2$ and Br$_2$ were used instead of AsF$_5$. The Cl$_2$ and Br$_2$ were supplied at 1.5 atm. The transmittance of the graphene including Cl and the graphene including Br was about 82%.

Example 5

A graphene sheet including Na and K was prepared in the same manner as in Example 1, except that an alloy of Na and K was used instead of potassium. In the Na and K alloy, the molar ratio of Na and K was the same. The transmittance of the graphene including the Na and K alloy was about 85%.

As described above, according to the disclosed embodiments, a graphene sheet including an intercalation compound may have controlled electrical, optical, and physical properties according to the type and amount of intercalated compounds without deteriorating the intrinsic physical properties of the graphene sheet, such as excellent electrical properties, transparency, and flexibility. The graphene sheet may be efficiently applied to various devices including transparent and flexible display devices, batteries, or memory devices.

It should be understood that the exemplary embodiments described therein should be considered in a descriptive sense only and not for purposes of limitation. Descriptions of features or aspects within each embodiment should be considered as available for other similar features or aspects in other embodiments.

What is claimed is:

1. A graphene sheet, comprising:
an intercalation compound; and
2 to about 300 unit graphene layers, wherein
each of the unit graphene layers comprises a polycyclic aromatic molecule in which a plurality of carbon atoms in the polycyclic aromatic molecule are covalently bonded to each other; and wherein
the intercalation compound is interposed between the unit graphene layers.

2. A transparent electrode comprising a graphene sheet comprising an intercalation compound according to claim 1.

3. A solar cell comprising the transparent electrode of claim 2.

4. A conductive thin film comprising a graphene sheet comprising an intercalation compound according to claim 1.

5. A display device comprising the conductive thin film of claim 4.

6. The graphene sheet of claim 1, wherein the intercalation compound is regularly and periodically arranged.

7. The graphene sheet of claim 1, wherein about 1 to about 4 unit graphene layers are interposed between layers comprising the intercalation compound.

8. The graphene sheet of claim 1, wherein, the graphene sheet has a tetragonal structure and each of a width and a length of the graphene sheet is about 1 to about 1,000 millimeters.

9. The graphene sheet of claim 1, wherein the graphene sheet has a circular shape and a diameter of the graphene sheet is about 1 to about 1,000 millimeters.

10. The graphene sheet of claim 1, wherein the intercalation compound comprises at least one selected from the group consisting of an alkali metal, a halogen atom, a metal halide, an organic compound, an acidic compound, and any mixtures thereof.

11. The graphene sheet of claim 1, wherein the intercalation compound comprises at least one selected from the group consisting of lithium, sodium, potassium, rubidium, cesium, fluorine, chlorine, bromine, iodine, IBr, ICl, AsF$_5$, FeCl$_2$, NiCl$_2$, CoCl$_2$, pentacene, tetracene, anthracene, 9,10-dichloroanthracene, 9,10-dibromoanthracene, acetic acid, nitric acid, hydrochloric acid, sulfuric acid, and any mixtures thereof.

12. The graphene sheet of claim 1, wherein a transmittance of the graphene sheet is about 5 to about 95 percent.

13. The graphene sheet of claim 1, wherein the graphene sheet is flexible.

14. A hydrogen storage medium comprising a graphene sheet comprising an intercalation compound according to claim 1.

15. An electrical device comprising a graphene sheet comprising an intercalation compound according to claim 1.

16. A process of preparing a graphene sheet comprising an intercalation compound, the process comprising:
forming a graphene sheet; and
intercalating an intercalation compound into the graphene sheet using at least one method selected from the group consisting of 2-region vapor phase transport, constant temperature vapor phase transport, an electrochemical method, liquid phase intercalation, and any mixtures thereof.

17. The process of claim 16, wherein the forming the graphene sheet comprises:
preparing a substrate having a graphitizing catalyst disposed on at least one surface of the substrate;
contacting a carbonaceous material with the substrate on which the graphitizing catalyst is disposed; and
heat treating the carbonaceous material and the graphitizing catalyst in an inert or a reducing atmosphere to form graphene.

18. The process of claim 17, wherein the carbonaceous material is selected from the group consisting of a carbon-containing polymer, a gaseous carbonaceous material, a liquid carbonaceous material, and any mixtures thereof.

19. The process of claim 17, wherein the graphitizing catalyst has a single crystalline structure.

20. The process of claim 17, wherein the contacting the carbonaceous material with the substrate is performed using at least one method selected from the group consisting of:
coating the carbonaceous material on the substrate on which the graphitizing catalyst is disposed, wherein the carbonaceous material is a carbon containing polymer;
supplying the carbonaceous material onto the substrate on which the graphitizing catalyst is disposed, wherein the carbonaceous material is a gaseous carbonaceous material; and
immersing the substrate on which the graphitizing catalyst is disposed in the carbonaceous material to form an immersed substrate, and pre-heat-treating the immersed substrate, wherein the carbonaceous material is a liquid carbonaceous material
and any combinations thereof.

21. The process of claim 17, wherein the graphitizing catalyst comprises at least one selected from the group consisting of Ni, Co, Fe, Pt, Au, Al, Cr, Cu, Mg, Mn, Mo, Rh, Si, Ta, Ti, W, U, V, Zr, and any mixtures thereof.

22. The process of claim 17, wherein the heat treatment is performed at a temperature of about 400 to about 2,000° C. for about 0.1 to about 10 hours.

23. The process of claim 17, further comprising removing the graphitizing catalyst by acid treatment after the heat treatment.

24. The process of claim 16, wherein the 2-region vapor phase transport comprises:
disposing the graphene sheet in a first chamber of a reactor and disposing the intercalation compound in a second chamber of the reactor, wherein the first chamber and the second chamber are connected to each other through a pathway; and independently heating each of the first chamber and the second chamber.

25. The process of claim 16, wherein the constant temperature vapor phase transport comprises supplying a vapor phase intercalation compound into a chamber in which the graphene sheet is disposed, wherein the temperature of the chamber is maintained at a constant temperature.

26. The process of claim 16, wherein the liquid phase intercalation comprises immersing the graphene sheet in a liquid phase intercalation compound or in a solution of an intercalation compound to form an intercalated graphene sheet, and drying the intercalated graphene sheet.

27. The process of claim 16, wherein the electrochemical method comprises intercalating the intercalation compound into the graphene sheet by electrolysis in an electrolyte using the graphene sheet as an electrode and the intercalation compound as a counter electrode.

28. The process of claim 16, wherein at least two methods selected from the group consisting of 2-region vapor phase transport, constant temperature vapor phase transport, an electrochemical method, and liquid phase intercalation are sequentially performed.

29. The process of claim 16, wherein the intercalation compound comprises at least one selected from the group consisting of an alkali metal, a halogen atom, a metal halide, an organic compound, an acidic compound, and any mixtures thereof.

30. A process of preparing a graphene sheet comprising an intercalation compound, the process comprising:

intercalating an intercalation compound into graphite using at least one method selected from the group consisting of 2-region vapor phase transport, constant temperature vapor phase transport, an electrochemical method, and liquid phase intercalation;

mechanically cutting the graphite into which the intercalation compound is intercalated; and repeating the cutting of the graphite to obtain a graphene sheet comprising an intercalation compound.

31. The process of claim 30, wherein the mechanically cutting comprises separating graphite using an adhesive tape.

* * * * *